United States Patent [19]
Ezaki et al.

[11] Patent Number: 6,077,735
[45] Date of Patent: *Jun. 20, 2000

[54] METHOD OF MANUFACTURING SEMICONDUCTOR DEVICE

[75] Inventors: Yuji Ezaki, Tsuchiura; Shinya Nishio, Musashimurayama; Fumiaki Saitoh, Akishima; Hideo Nagasawa, Ohme; Toshiyuki Kaeriyama, Yawara-mura; Songsu Cho, Fujishiro-machi; Hisao Asakura, Ohme; Jun Murata, Kunitachi; Yoshitaka Tadaki, Hannoh; Toshihiro Sekiguchi, Hidaka; Keizo Kawakita, Ohme, all of Japan

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/708,104

[22] Filed: Aug. 28, 1996

[30] Foreign Application Priority Data

Aug. 31, 1995 [JP] Japan .................................. 7-248633

[51] Int. Cl.⁷ .............................................. H01L 21/8238
[52] U.S. Cl. .......................... 438/225; 438/223; 438/227; 438/228; 257/371; 257/396
[58] Field of Search .................................. 438/225, 227, 438/228, 223, 440; 257/371, 396

[56] References Cited

U.S. PATENT DOCUMENTS

| | | | |
|---|---|---|---|
| 5,343,064 | 8/1994 | Spangler et al. ........................ | 257/350 |
| 5,372,951 | 12/1994 | Anjum et al. ........................... | 438/440 |
| 5,496,758 | 3/1996 | Ema ......................................... | 438/253 |
| 5,504,031 | 4/1996 | Hsu et al. ................................ | 437/57 |
| 5,504,708 | 4/1996 | Santin et al. ............................. | 257/390 |

FOREIGN PATENT DOCUMENTS 63-55954  3/1988  Japan .

OTHER PUBLICATIONS

Stanley Wolf Silicon Processing for the VSLI Era vol. 1 Lattice Press pp. 306–307, 1896.

Primary Examiner—Charles Bowers
Assistant Examiner—David S Blum
Attorney, Agent, or Firm—William B. Kempler; Frederick J. Telecky, Jr.

[57] ABSTRACT

A method of making semiconductor devices which enables control of the impurity concentration and fine patterning by making removal of residual stress due LOCOS oxidation compatible with the formation of deep wells. A selective oxide layer is formed for separating element regions on a principal plane of a semiconductor substrate, for example, a p⁻-type silicon substrate 1. A mask is formed (for example photoresist 47) on the surface including the selective oxide layer and impurities (for example phosphorous) of a conductivity type opposite that of the semiconductor substrate are introduced via an opening in the mask. Then the selective oxide film is annealed by a high-temperature treatment while a deep well (for example n-type deep well 50) is formed by introducing the impurities.

7 Claims, 15 Drawing Sheets

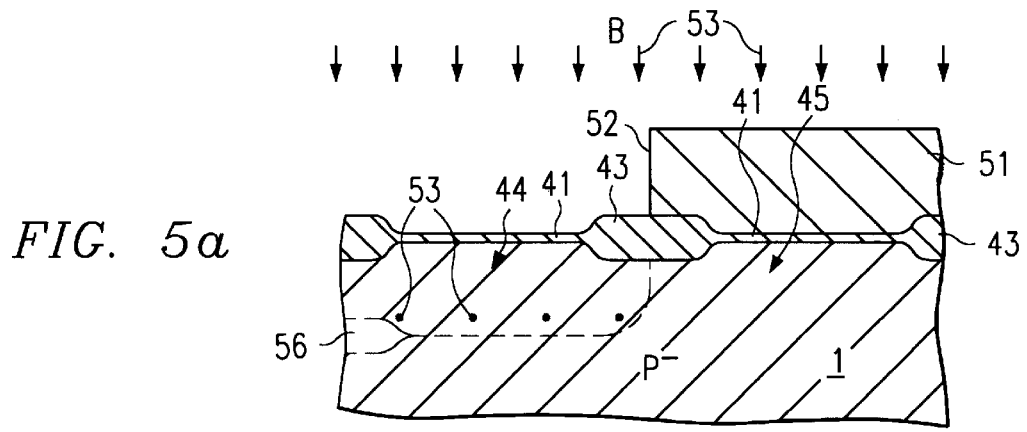
FIG. 5a
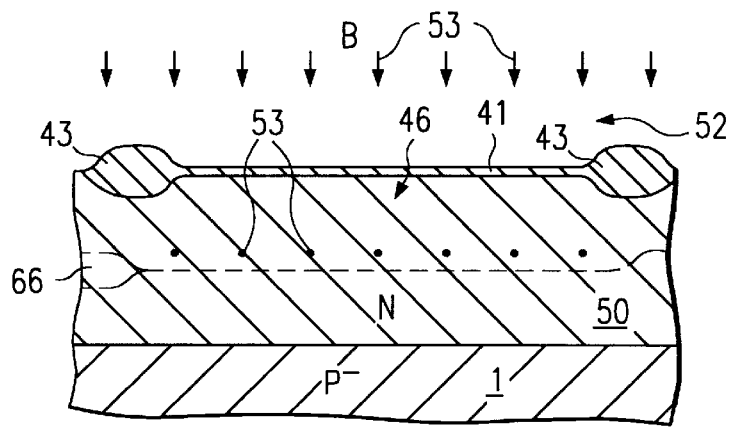
FIG. 5b
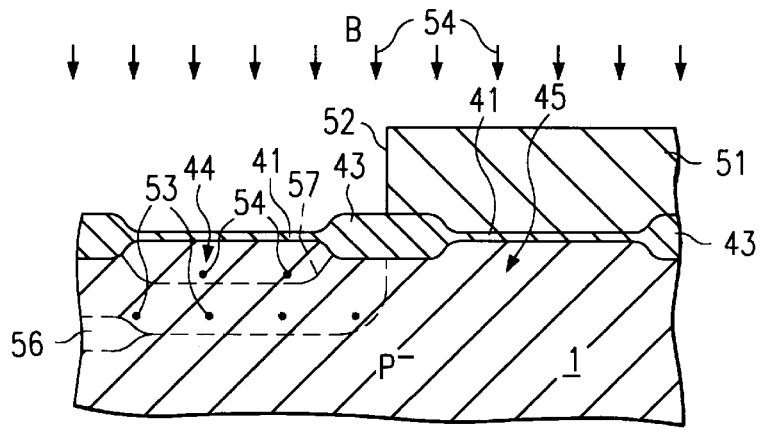
FIG. 6a
FIG. 6b

METHOD OF MANUFACTURING SEMICONDUCTOR DEVICE

FIELD OF THE INVENTION

Our invention relates to semiconductor integrated circuit device manufacture, and more particularly to methods of making semiconductor integrated circuit devices with high density very-large-scale integration (VLSI) circuits.

BACKGROUND OF THE INVENTION

In a conventional semiconductor integrated circuit device, a semiconductor substrate is divided into several element regions for the different elements by a selective oxide film or field oxide film by the LOCOS (local oxidation of silicon) method, and then the corresponding required elements are closely formed in each element region.

FIGS. 21–30 show a conventional manufacturing process for making complementary n-channel and p-channel metal oxide semiconductor field effect transistors (MOSFETs) on the same substrate using the LOCOS isolation method, used for example in making the peripheral circuit portion of a dynamic random access memory (DRAM). In FIG. 21, a thin $SiO_2$ film 2 is formed on one principal plane of a $p^-$-type silicon substrate 1, and a mask 3 of silicon nitride is selectively formed on it to specify the location for an n-type well region. Then impurities are ion-implanted into substrate 1 through an opening 5 in mask 3 by irradiating substrate 1 with a phosphorous ion beam 4, an n-type impurity of a conductivity type opposite to that of substrate 1, to form an n-type well 6 in substrate 1.

Next, as shown in FIG. 22, a thick $SiO_2$ layer 7 is selectively grown by LOCOS on n-type well 6 by thermal oxidation in a steam atmosphere. As shown in FIG. 23, after nitride mask 3 is removed, a p-type well 9 is formed in self-aligned fashion adjacent to n-type well 6 by irradiating a boron ion beam 8, a p-type impurity of the same conductivity type as substrate 1, using $SiO_2$ layer 7 as a mask (well 9 can also be formed by a solid-phase diffusion of impurities). The respective impurities of wells 6 and 9 are diffused by annealing at a high temperature of 1100–1200° C., so that the intended depth and impurity concentration are attained.

Then $SiO_2$ layers 2 and 7 of the surface are removed by etching as shown in FIG. 24. As a result, a step difference 10, for example of about 1000–1500 Å, is formed between the two wells 6 and 9.

As shown in FIG. 25, after the formation of a surface oxide film 11, an oxidation-resistant mask 12 of silicon nitride is formed in a prescribed pattern on wells 6 and 9 using the step difference 10 between wells 6 and 9 as a reference mark. Then, using mask 12, a field $SiO_2$ layer 13 is selectively formed by LOCOS oxidation around the periphery of each well.

Next, a photoresist mask 14 is formed as shown in FIG. 26 in a prescribed pattern for forming a channel stopper, and a boron ion beam 15, a p-type impurity, is irradiated through $SiO_2$ layer 13 at openings 16 in mask 14 to ion-implant a $p^+$-type region 17 as a channel stopper at the periphery of p-type well 9.

As shown in FIG. 27, photoresist mask 14 is then removed, and another photoresist mask 18 is applied. A phosphorous ion beam 19, an n-type impurity, is irradiated through the $SiO_2$ layer 13 at openings 20 in mask 18 to ion-implant an $n^+$-type region as a channel stopper 21 at the periphery of n-type well 6.

After growing a gate oxide film 22 on the surface of each well 6 and 9, polysilicon gate electrodes 23 and 24, insulating $SiO_2$ layers 25, and nitride side walls 26 are respectively formed as shown in FIG. 28. Then, a photoresist mask 27 is applied to cover n-type well 6, and a phosphorous ion beam 28, an n-type impurity, is irradiated, so that $n^+$-type impurity-implanted regions (source and drain regions) 29, 30 are formed in self-aligned fashion in p-type well 9.

Photoresist mask 27 is removed and another photoresist mask 31 is formed as shown in FIG. 29. Then a boron ion beam 32, a p-type impurity, is irradiated, to impurity-implant $p^+$-type regions (source and drain regions) 33, 34 in a self-aligned fashion in n-type well 6. Then mask 31 is removed.

Next, as shown in FIG. 30, an insulating layer 35 is deposited on the entire surface, into which contact holes 36 are respectively formed to each impurity-implanted source/drain region 29, 30, 33, and 34, and respective electrodes 37, 38, 39, and 40 (source or drain electrodes) are deposited in the contact holes. Thus, an n-channel MOSFET $Tr_1$ is made on p-type well 9 and a p-channel MOSFET $Tr_2$ on n-type well 6.

However, this conventional manufacturing process has the following problems (a)–(e).

(a) The number of processes required for preparing and constructing necessary elements (here MOSFET transistors $Tr_1$ and $Tr_2$) in wells 6 and 9 is increased, and the process is complicated.

(b) Oxide films 7 (FIG. 22) and 13 (FIG. 25) selectively grown by LOCOS have tips with an A-shaped bird's beak. Since the residual stress on the bird's beak results in current leakage, etc. and is apt to deteriorate the reliability and electrical characteristics of the semiconductor device, it is necessary to remove the residual stress by a high-temperature annealing treatment. However, since oxide film 13 is grown by LOCOS after wells 6 and 9 are formed by ion beam irradiation (see FIG. 25), in practice it is necessary to add a high-temperature annealing treatment after the LOCOS step, increasing the number of processes. Moreover, such an annealing treatment is earlier required after LOCOS growing of oxide film 7 (see FIG. 22), so the annealing treatment after the LOCOS oxidation must be carried out at least twice.

(c) Selectively growing oxide film 13 by LOCOS (FIGS. 24, 25) introduces a step 10 between wells 6 and 9. Because step 10 remains even after subsequent processing, this process is not suitable for fine patterning. For example, when simultaneously patterning the polysilicon gate electrodes 23 and 24 shown in FIG. 28, the exposure pattern for the photoresist can be focused on only one of the two wells, so the other well is defocused. The result is either gate terminal 23 or 24 is not patterned as designed.

(d) It is difficult to match the impurity concentration profile required for forming wells 6 and 9 to the impurity concentration profile required for the desired threshold voltages of transistors $Tr_1$ and $Tr_2$ provided in these wells. In other words, after the well-forming ion implantation of FIGS. 21 and 23, in practice implanted impurities move in from the surface of wells 6, 9 by thermal diffusion (well diffusion) so that the impurity concentrations at the well surface and interior end up changed.

(e) For this reason, to obtain a transistor which operates at a desired threshold voltage, it is necessary to separately form a diffusion mask for threshold voltage control on the well and to rediffuse necessary impurities. Moreover, to obtain transistors with different threshold voltages, a different diffusion mask is required for each. Therefore, the number of masks increases, and the manufacturing process becomes more complicated.

Therefore, an object of our invention is to provide a better method of manufacturing semiconductor devices which enables easy control of impurity concentrations and fine patterning, by making removal of residual stress due to LOCOS growing compatible with the formation of deep wells.

SUMMARY OF INVENTION

Our method of making a semiconductor device includes a process which forms a selective oxide layer (for example, a selective oxide film 43, which will be mentioned later) for separating element regions on one principal plane of a semiconductor substrate (for example, the p$^-$-type silicon substrate 1, which will be mentioned later), a process which forms a mask (for example, a photoresist 47, which will be mentioned later) on the surface including the selective oxide layer and introduces impurities of a conductivity type opposite that of the above-mentioned semiconductor substrate via an opening of the mask, and a process which simultaneously anneals the above-mentioned selective oxide film by a high-temperature treatment when a deep well (for example, an n-type deep well 50, which will be mentioned later) is formed by the above-mentioned introduced impurities.

According to the manufacturing method, after the selective oxide layer for element separation is formed, impurities of a conductivity type opposite the semiconductor substrate is introduced, and a deep well is formed by a high-temperature treatment. At the same time, the selective oxide film is annealed. Thus, the residual stress from the selective oxide layer can be removed, and desired well concentration and threshold voltage can be obtained by activating the deep well. Furthermore, they can be realized without the addition of the subsequent high-temperature annealing treatment and the impurity diffusion of the threshold voltage adjustment, and the number of processes can be reduced. Also, since only one selective oxidation may be sufficient at the time of forming the deep well, the surface between the element regions separated by the selective oxidation layer is held on the same surface, so that the pattern can be exposed with high precision and a fine pattern of gate electrodes, etc., can be formed.

Thus, compared with the above-mentioned conventional technique, the manufacturing method can provide a stable LOCOS insulating (insulation due to the selective oxide film) structure, in which the stress corresponding to a semiconductor substrate is relaxed. At the same time, high-temperature annealing after the LOCOS may be carried out at the initial stage of the manufacturing process, and at that time, since the threshold voltage in the well can be simultaneously adjusted at the time of formation of the deep well, the diffusion mask and the process for adjusting the threshold voltage can be omitted.

In the manufacturing method of our invention, as a preferable application pattern, after carrying out the LOCOS (formation of the selective oxide film) by a high-temperature process at the initial stage of the semiconductor manufacturing process, the well (deep well: D-WELL) extending up to the deep region is ion-implanted using the LOCOS region as a mark. Then, the well is activated by annealing at 1200° C. for 3 h in a nitrogen atmosphere, for instance, and is used as a region for forming a transistor operating at a desired threshold voltage.

Furthermore, the mask is applied on the substrate, and a well for a transistor of the peripheral circuit part of the DRAM cell is formed, so that a transistor with two or three kinds of threshold voltages can be easily obtained.

In this case, preferably, after a first element region (for example, a memory cell region 46 of the DRAM which will be mentioned later), in which a deep well is formed, and a second element region (for example, an n-channel MOS transistor formation region 44 of the cell peripheral circuit part which will be mentioned later), in which a deep well is formed, are respectively formed by a selective oxide film, and a mask is formed on the surface including the above-mentioned selective oxide layer.

Then, impurities (for example, boron) of the same conductivity type as the semiconductor substrate are introduced into the above-mentioned second element region and deep well from the opening of the above-mentioned mask, and a low-resistance embedded region (for example, p-type regions 56 and 66 which will be mentioned later) for lowering a sheet resistance is formed.

Thereafter, using the above-mentioned mask, impurities (for example, boron) of the same conductivity type as the above-mentioned impurities are introduced into the above-mentioned low-resistance embedded region, and an impurity introduction region (for example, p$^+$-type channel stoppers 57 and 67 which will be mentioned later) for separating elements are formed.

Furthermore, using the above-mentioned mask, impurities (for example, boron) of the same conductivity type are introduced into the above-mentioned impurity-introduction region, and the surface impurity concentration (in particular, the threshold value of the transistor) is specified.

In other words, if the total amount of impurities introduced is preset by introducing the above-mentioned impurities at least three times under the same mask, so that the reference value (in particular, the natural $V_t$ which is the lowest threshold voltage) of the surface impurity concentration can be obtained, the intended surface concentration (that is, the natural $V_t$) is always obtained, unlike the conventional technique in which the desired $V_t$ cannot be obtained due to the difference between the surface concentration and the internal concentration. Furthermore, an additional impurity diffusion for adjusting the threshold voltage is not necessary. Then, when various high $V_t$ values (standard $V_t$ and high $V_t$) are required for the natural $V_t$, impurities may be appropriately introduced, however since the introduction of impurities for adjusting the above-mentioned natural $V_t$ is not necessary, the number of masks and processes required for the transistor to operate at different threshold voltages (for example, starting with the natural $V_t$, standard $V_t$ and high $V_t$) can be simplified.

In this case, a third element region (for example, a p-channel MOS transistor-forming region 45 of the peripheral part of the cell, which will be mentioned later) is formed beside the second element region.

Then, neither is a deep well formed in the third element region, nor are impurities of the same conductivity type as the semiconductor substrate introduced. However, impurities (for example, phosphorous) of a conductivity type opposite that of the above-mentioned semiconductor substrate are introduced from the opening gate of a mask formed on the surface containing a selective oxide film so that an impurity-introduced region (for example, an n-type region 61 which will be mentioned later) is formed.

Furthermore, using the above-mentioned mask, the above-mentioned impurities (for example, phosphorous) with the opposite conductivity type are introduced into the above-mentioned impurity-introduced region, so that an impurity-introduced region (for example, a N+ type channel stopper 63 which will be mentioned later) for separating elements is formed.

Thus, the desired surface impurity concentration is also obtained by a partial cancellation with the impurity concentration of the semiconductor substrate, even by introducing the impurities of opposite conductivity type, and the impurities for separating the elements can be introduced together.

Also, after the respective above-mentioned impurities of a [desired] conductivity type are implanted, annealing is preferably carried out to activate the implanted region and not to substantially cause the concentration change in the impurities introduced. The annealing condition may be 1000° C. and 30 min, for instance.

The insulated-gate field-effect transistors (for example, n-channel MOS transistors $TR_1$ and $TR_3$ of a conductivity type reverse to the semiconductor substrate, which will be mentioned later) are respectively formed in the above-mentioned first element region and second element region by the manufacturing method of our invention. An insulated-gate field-effect transistor (for example, p-channel MOS transistor $TR_2$ to be mentioned later) with a channel of the same conductivity type as the semiconductor substrate can be formed in the third element region.

BRIEF DESCRIPTION OF THE DRAWINGS

FIGS. 5*a*, 5*b* are cross sections of the main parts showing another stage.

FIGS. 6*a*, 6*b* are cross sections of the main parts showing another stage.

In the figures, 1 is a p−-type silicon substrate, 42 an oxidation-resistant mask, 43 a selective oxide film (field $SiO_2$ film), 44, 45, and 46 element regions, 47, 51, 58, 69, 87, and 91 photoresist masks, 49, 53, 54, 55, 60, 62, 71, 88, and 92 ion beams or implantation ions, 50 an n-type deep well, 56 and 66 p-type regions, 57 and 67 $p^+$-type channel stoppers, 61 an n-type region, 63 an $n^+$-type channel stopper, 64, 65, and 68 surface regions, and 73, 74, and 77 polysilicon gate electrodes. Parts 75, 95, and 101 are $SiO_2$ layers, 79, 80, 89, and 90 $n^+$-type regions (source or drain regions), 93 and 94 $p^+$-type regions (source or drain regions), 97 a polysilicon storage node electrode, 98 a dielectric film, 99 a polysilicon plate electrode, 102 a bit line, BP1, BP2, and BP3 boron ion implantations, BN1 and BN2 phosphorous ion implantations, PC a peripheral circuit part, MA a memory cell array part, MC a memory cell, $TR_1$, $TR_2$, $TR_3$, and $TR_3'$ MOS transistors, CAP and CAP' capacitors, IP a concentration profile, and IP' a retrograde concentration profile part.

DETAILED DESCRIPTION

Figure 1A:
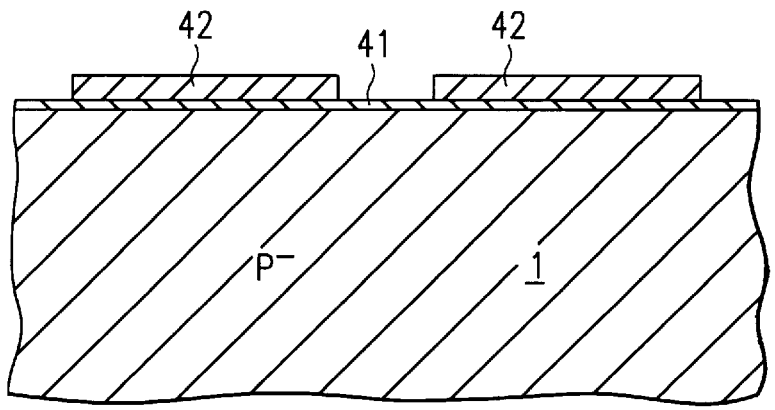
FIGS. 1*a*, 1*b* are cross sections of the main parts showing one stage of the manufacturing process of the dynamic RAM which is the embodiment of our invention.
Figure 1B:
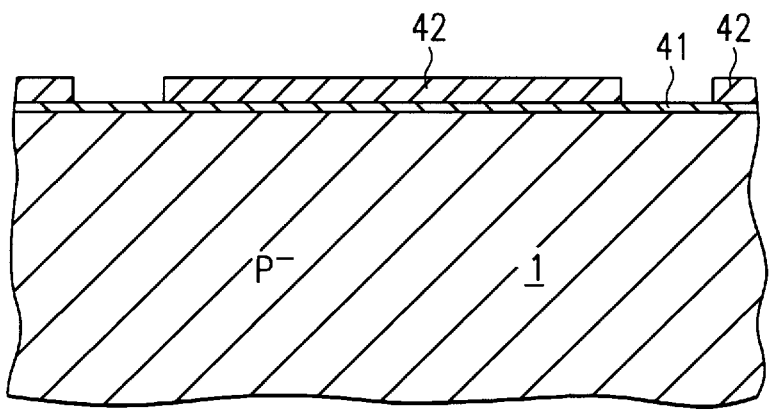

FIGS. 1–20 show embodiments in which our invention is applied to making a DRAM. The DRAM has a memory cell array MA and a peripheral cell part PC of the cell. In its manufacture, as shown in FIGS. 1*a*, 1*b* first a thin $SiO_2$ film 41 is formed on one principal plane of a p−-type silicon substrate 1 with an impurity concentration of $1 \times 10^{15}/cm^3$.

Then an oxidation-resistant mask 42 of silicon oxide for the LOCOS process is formed in a prescribed pattern on it.

Figure 2A:
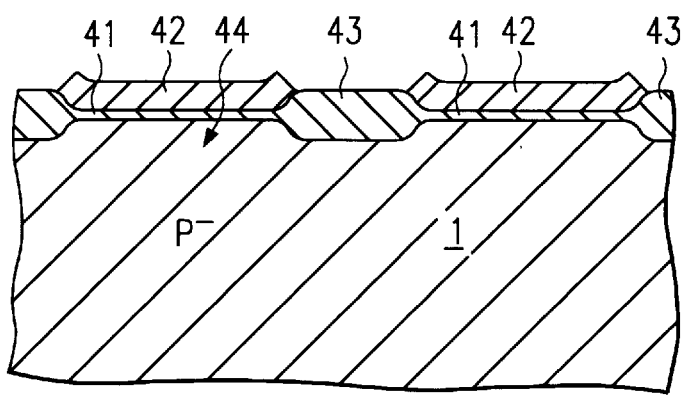
FIGS. 2*a*, 2*b* are cross sections of the main parts showing another stage.
Figure 2B:
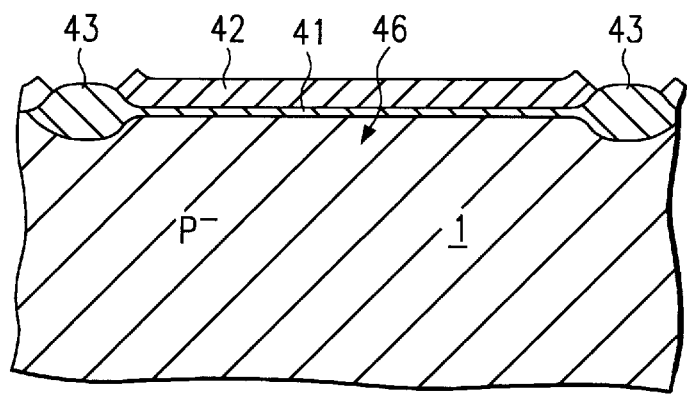

Next, as shown in FIGS. 2a, 2b, a field SiO$_2$ film 43 is selectively formed on substrate 1, for example to a thickness of 4000 Å, by the LOCOS method (for example, at an oxidation temperature of 1100° C.), around element regions 44, 45, and 46. Also, the SiO$_2$ film is further vertically etched and used as a direct moat region (element region), and the high integration of the circuit can be realized while removing the bird's beak.

Figure 3A:
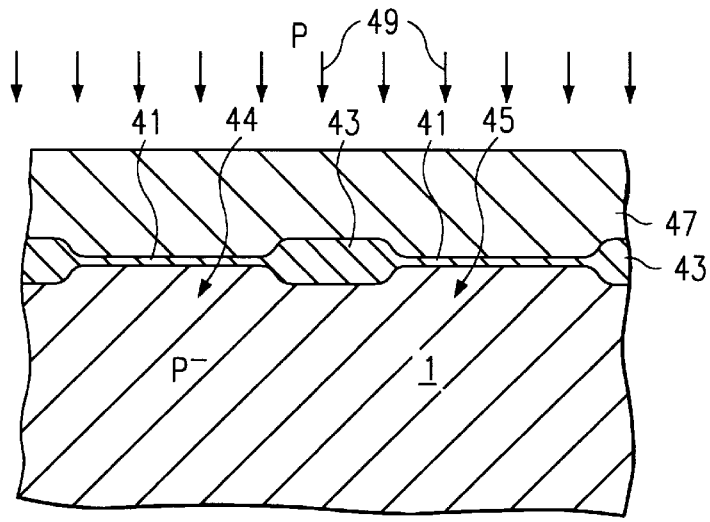
FIGS. 3*a*, 3*b* are cross sections of the main parts showing another stage.
Figure 3B:
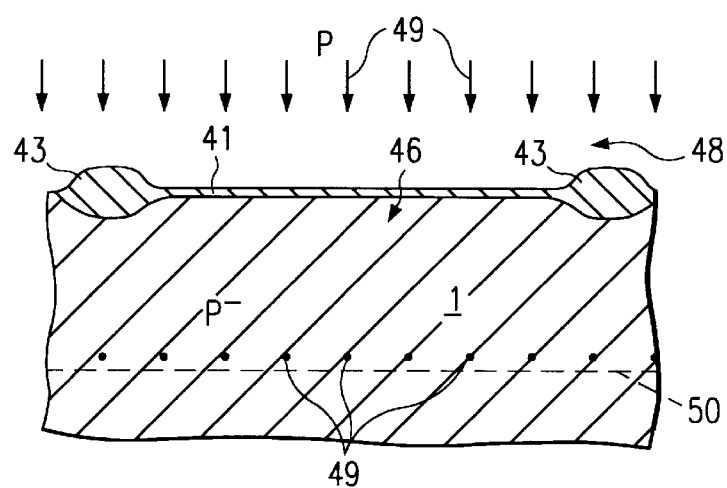

Next, as shown in FIGS. 3a, 3b, after the removal of the mask 42, element regions 44 and 45 of the peripheral circuit part PC are masked, while the memory cell array part MA is exposed. Then, an n-type impurity such as phosphorous ion beam 49 is irradiated onto it via an opening 48 of the mask 47. Thus, the n-type impurity 49 is ion-implanted at a high energy of 500 keV and a dosage of 6×10$^{12}$/cm$^2$, for instance, into the deep position of substrate 1, and a region 50 for a deep well is specified. The implanting ions 49 are also implanted under the field SiO$_3$ film 43.

Figure 4A:
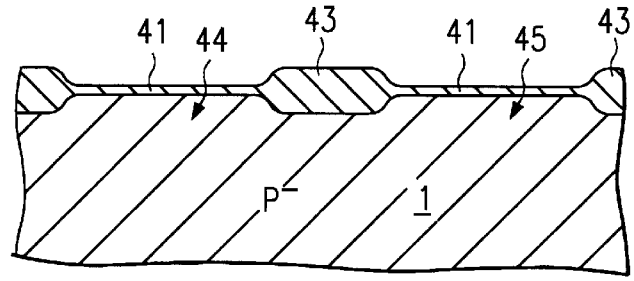
FIGS. 4*a*, 4*b* are cross sections of the main parts showing another stage.
Figure 4B:
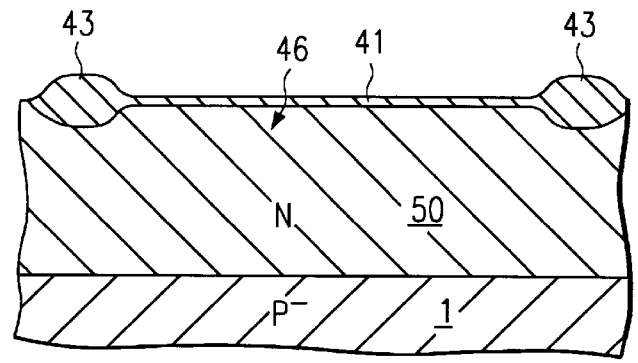

Next, annealing is carried out at high temperature of about 1200° C. for 3 h in an atmosphere of an inert gas such as nitrogen. Thus, as shown in FIGS. 4a, 4b, the deep n-type well 50 is activated on substrate 1 by the above-mentioned implanted impurities 49, and the impurity concentration of 2×10$^{16}$/cm$^2$ is formed. At that time, the residual stress due to the above-mentioned field SiO$_2$ film 43 formed by the thermal oxidation (LOCOS) can be sufficiently relaxed.

Next, as shown in FIGS. 5a, 5b, only the element region 45 of the peripheral circuit part PC is covered with a photoresist mask 51, and a p-type impurity such as boron ion beam 53 is relatively deeply implanted at a high energy of 300 keV and a dosage of 8× 10$^{12}$/cm$^2$, for instance, into element regions 44 (p$^-$-type substrate 1) and 46 (n-type deep well 50) from opening 52. This implantation lowers the sheet resistance of the p-type regions 56 and 66 and forms a retrograde concentration profile, which will be mentioned later, and is sometimes called boron ion implantation 1 (BP1).

Next, as shown in FIGS. 6a, 6b, using the above-mentioned mask 51, a p-type impurity such as boron ion beam 54 is implanted with energy lower than ion beam 53, for example energy of 180 keV and a dosage of 6×10$^{12}$/cm$^2$, for instance, into each element region. This implantation forms p$^+$-type channel stoppers 57 and 67 for separating elements and is sometimes called boron ion implantation 2 (BP2).

Figure 7A:
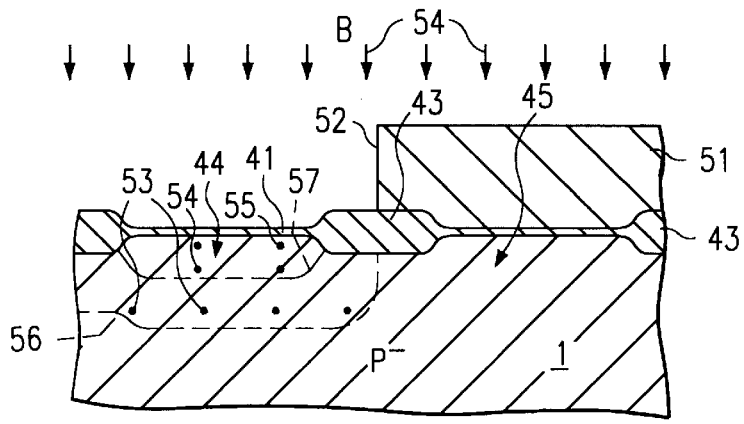
FIGS. 7*a*, 7*b* are cross sections of the main parts showing another stage.
Figure 7B:
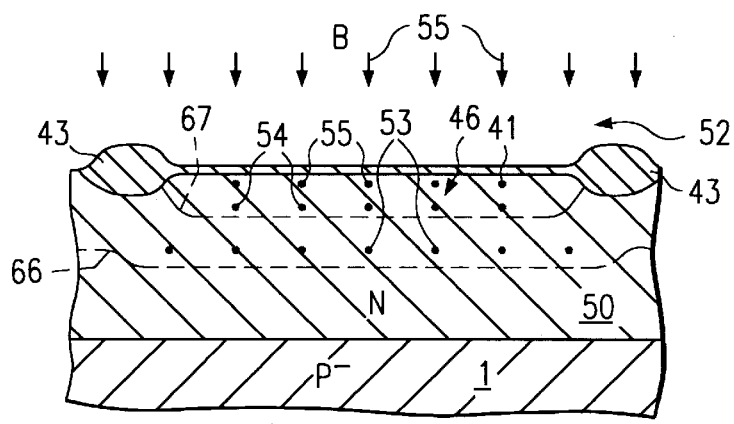

Next, as shown in FIGS. 7a, 7b, using the above-mentioned mask 51 unchanged, a p-type impurity such as boron ion beam 55 is implanted at a lower energy of 20 keV and a dosage of 2×10$^{12}$/cm$^2$, for instance, into element regions 44 and 46. This implantation specifies the respective dosages of the above-mentioned ion implantations 53 (BP1) and 54 (BP2) and the well surface impurity concentration of the element regions, so that a normal V$_t$ can be obtained by a multiplication action of each dosage and the concentration, and is sometimes called boron ion implantation 3 (BP3).

Figure 8A:
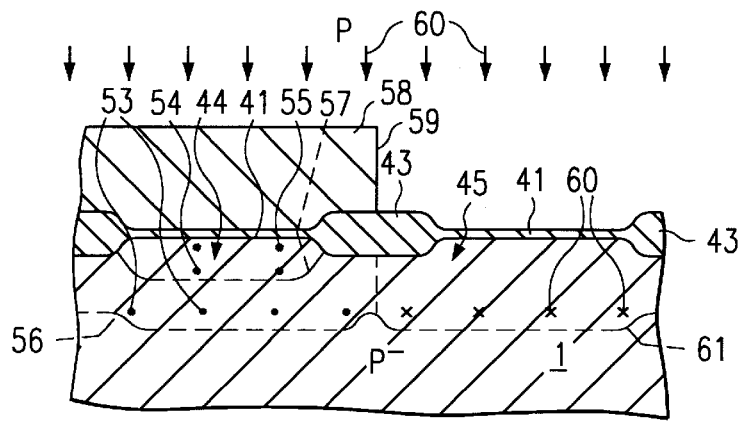
FIGS. 8*a*, 8*b* are cross sections of the main parts showing another stage.
Figure 8B:
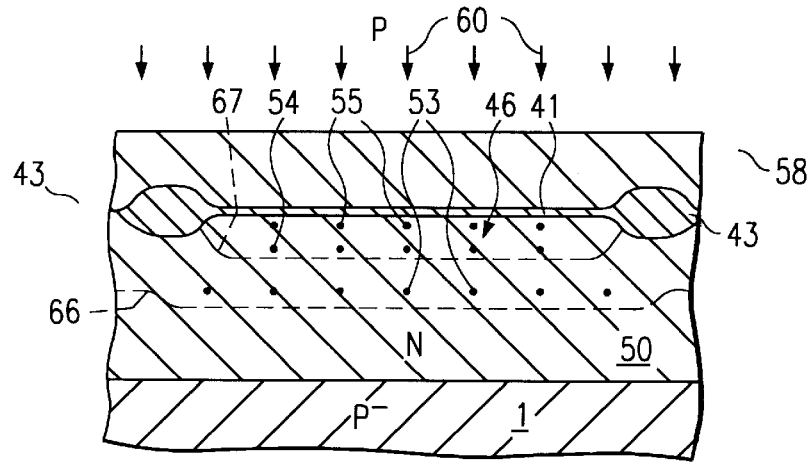

Next, as shown in FIGS. 8a, 8b, after the removal of the above-mentioned mask 51, the element regions 44 and 46 are covered with a photoresist mask 58, and an n-type impurity such as phosphorous ion beam 60 is relatively deeply implanted at an energy of 500 keV and a dosage of 2×10$^{13}$/cm$^2$ into the element region 45 via an opening 59. This implantation lowers the sheet resistance of n-type well 61 and forms the retrograde concentration profile, which will be mentioned later, and is sometimes called phosphorous ion implantation 1 (BN1).

Figure 9A:
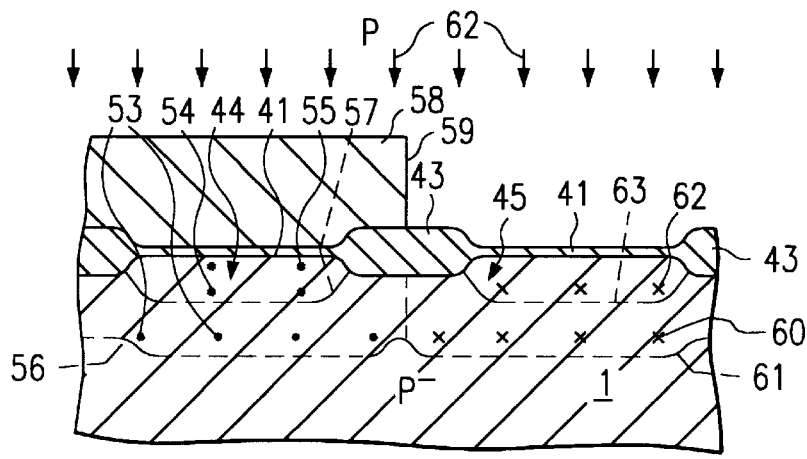
FIGS. 9*a*, 9*b* are cross sections of the main parts showing another stage.
Figure 9B:
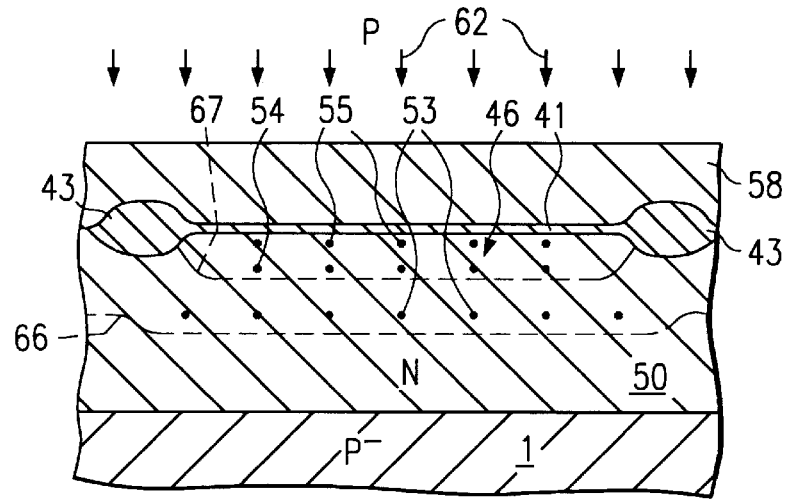

Next, as shown in FIGS. 9a, 9b, using the above-mentioned mask 58 unchanged, an n-type impurity such as phosphorous ion beam 62 is implanted at an energy of 250 keV, which is lower than that of the above-mentioned ion beam 60, and a dosage of 5×10$^{12}$/cm$^2$ into the element region 45. This implantation forms an n$^+$-type channel stopper 63 for separating elements and is sometimes called phosphorous ion implantation 2 (BN2).

In this case, the dosage of each of the above-mentioned ion implantations 60 (BN1) and 62 (BN2) can also be specified so that a desired surface impurity concentration of the element regions can be obtained by the multiplication action with each dosage.

Figure 10A:
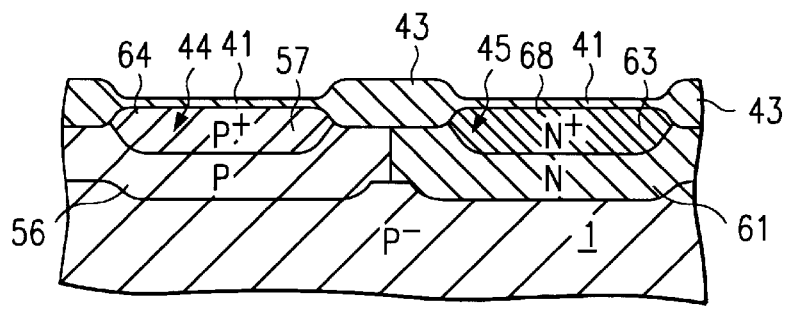
FIGS. 10*a*, 10*b* are cross sections of the main parts showing another stage.
Figure 10B:
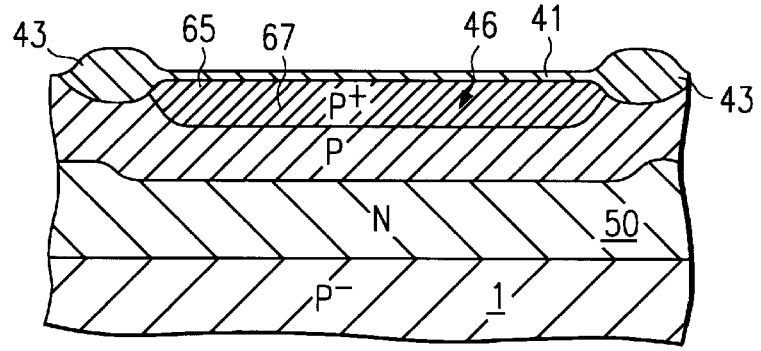

Next, as shown in FIGS. 10a, 10b, after the removal of the above-mentioned mask 58, the entire element region is annealed at a temperature of about 1000° C. for 30 min in an atmosphere of an inert gas such as nitrogen. Thus, each of the above-mentioned regions in which the impurities are implanted is activated, and in the element regions 44 and 46, p-type wells 56 and 66, p$^+$-channel stoppers 57 and 67, and surface regions 64 and 65 with a desired impurity concentration are respectively formed on the p$^-$-type substrate 1, so that a so-called triple well is formed. At the same time, in the element region 45, n-type well 61 adjacent to the above-mentioned p-type well 56, n$^+$-type channel stopper 63, and surface region 68 with a desired impurity concentration are respectively formed on the p-type substrate 1. Here, as the surface concentration impurity, 1×10$^{17}$/cm$^2$ in the element region 44, 3×10$^{17}$/cm$^2$ in the element region 45, and 8×10$^{16}$/cm$^2$ in the element region 46 can be respectively obtained.

In this case, to carry out annealing under the above-mentioned conditions, the concentration profile of each impurity-implanted region is not substantially changed, the above-mentioned surface concentration, etc., can be uniformly specified by the respective dosages of the ion implantations BP1, BP2, BP3, BN1, and BN2. In particular, in the element region 44, the threshold of the n-channel MOS transistor installed in the region can be specified by a combination of BP1, BP2, and BP3 so that the lowest value (natural V$_t$) can always be shown.

Figure 11A:
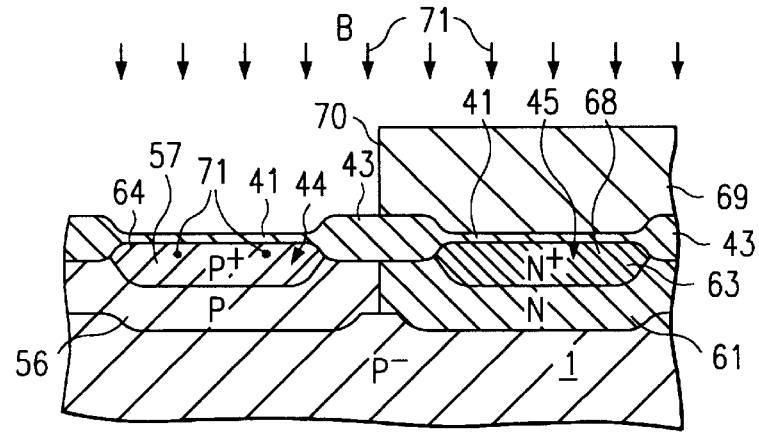
FIGS. 11*a*, 11*b* are cross sections of the main parts showing another stage.
Figure 11B:
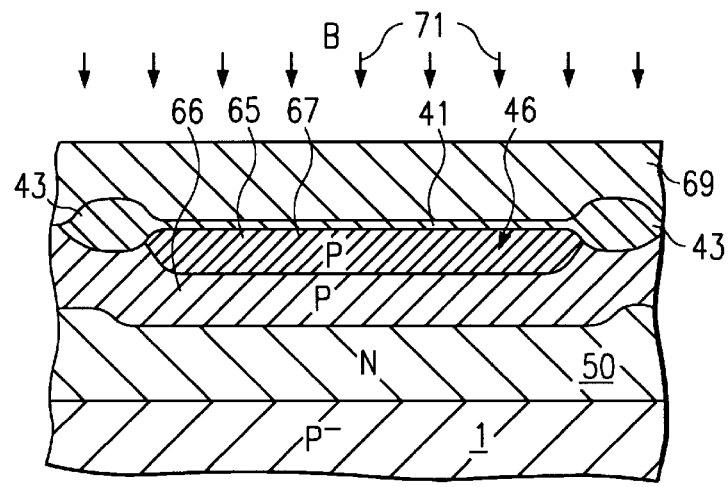

Also to fix the surface concentration of the element region 44 to the above-mentioned natural V$_t$, as shown in FIGS. 11a, 11b, the element regions 45 and 46 are covered with a photomask 69, and a p-type impurity such as boron ion beam 71 can be implanted via an opening 70. However, this implantation fixes the natural V$_t$, which has already been determined by the BP1, BP2, and BP3, and is substantially different from the conventional ion implantation for adjusting the threshold.

Figure 12A:
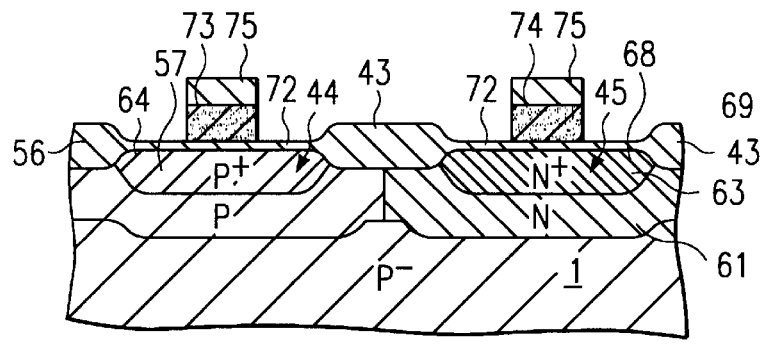
FIGS. 12*a*, 12*b* are cross sections of the main parts showing another stage.
Figure 12B:
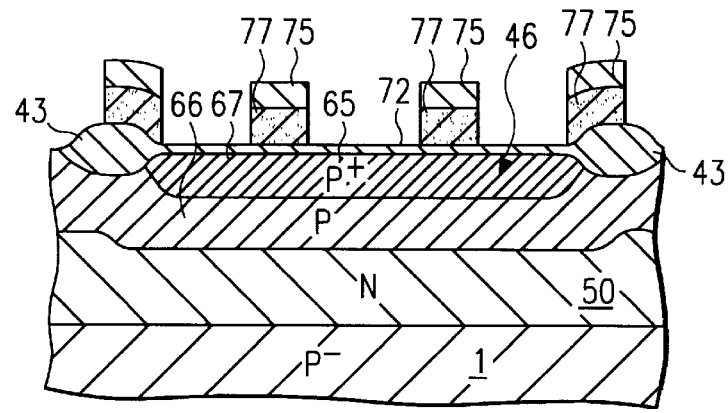

After each well is formed, as shown in FIGS. 12a, 12b, a gate oxide film 72 is grown on the surface of wells 56, 61, and 66, and polysilicon gate electrodes (word lines) 73, 74, and 77 and SiO$_2$ layer 75 are respectively formed in a prescribed pattern according to a normal method.

Figure 13A:
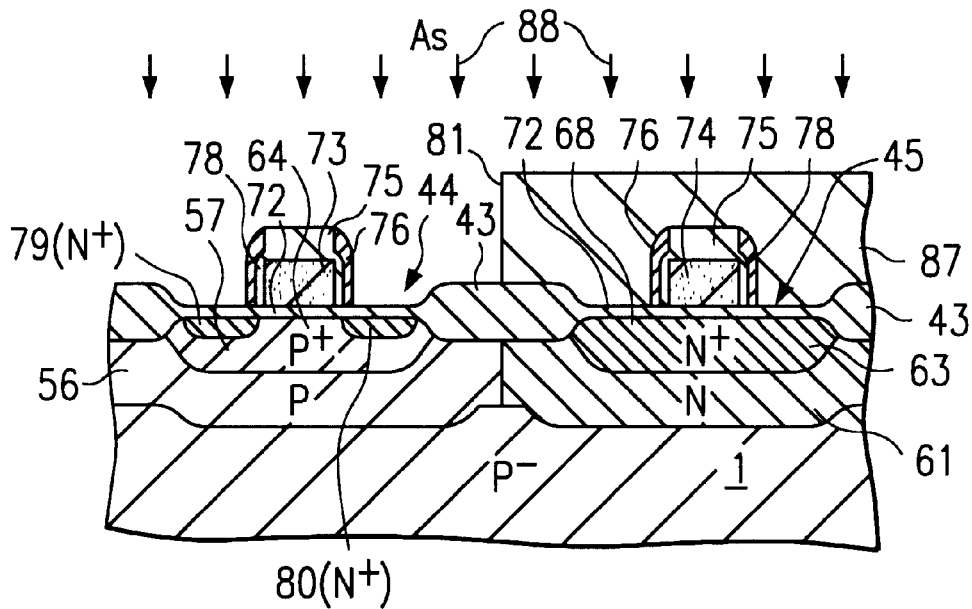
FIGS. 13*a*, 13*b* are cross sections of the main parts showing another stage.
Figure 13B:
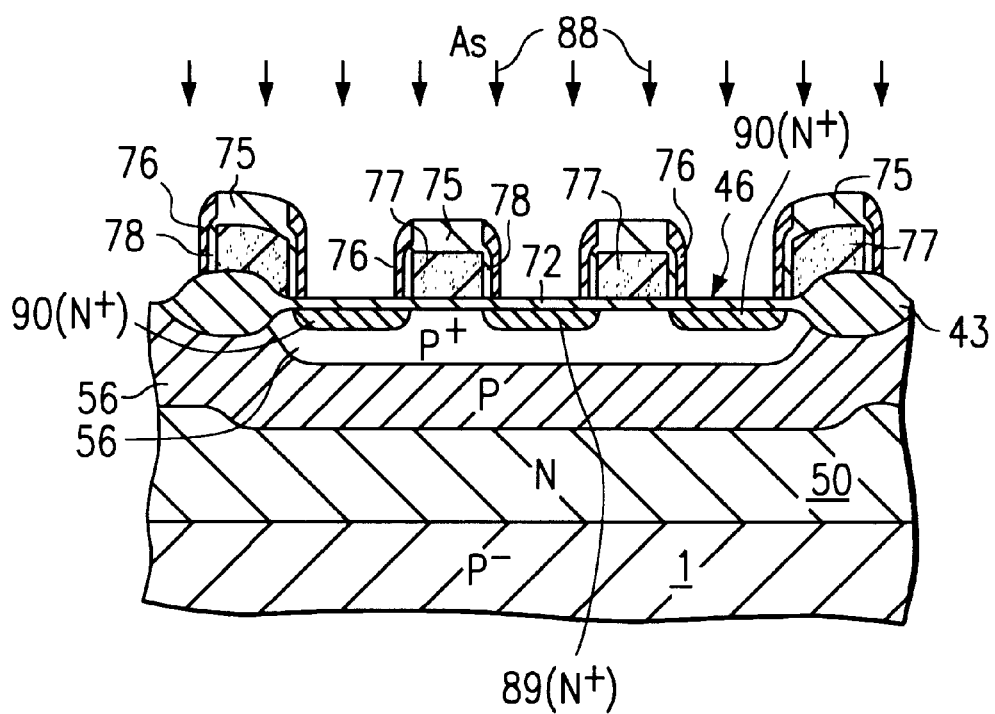

Next, as shown in FIGS. 13a, 13b, a nitride side wall 76 is respectively formed in a state in which the side surface has also been protected by a SiO$_2$ film 78, on the side of each gate electrode by oxidizing the side surface of each polysilicon gate electrode. Then, a photoresist mask 87 is covered on n-type well 61, and an n-type impurity such as arsenic or phosphorous ion beam 88 is irradiated through an opening 81. n$^+$-type impurity-implanted regions (source or drain regions) 79, 80 and 89, 90 are formed in a self-aligned fashion into the p$^+$-type regions 57 and 67.

Figure 14A:
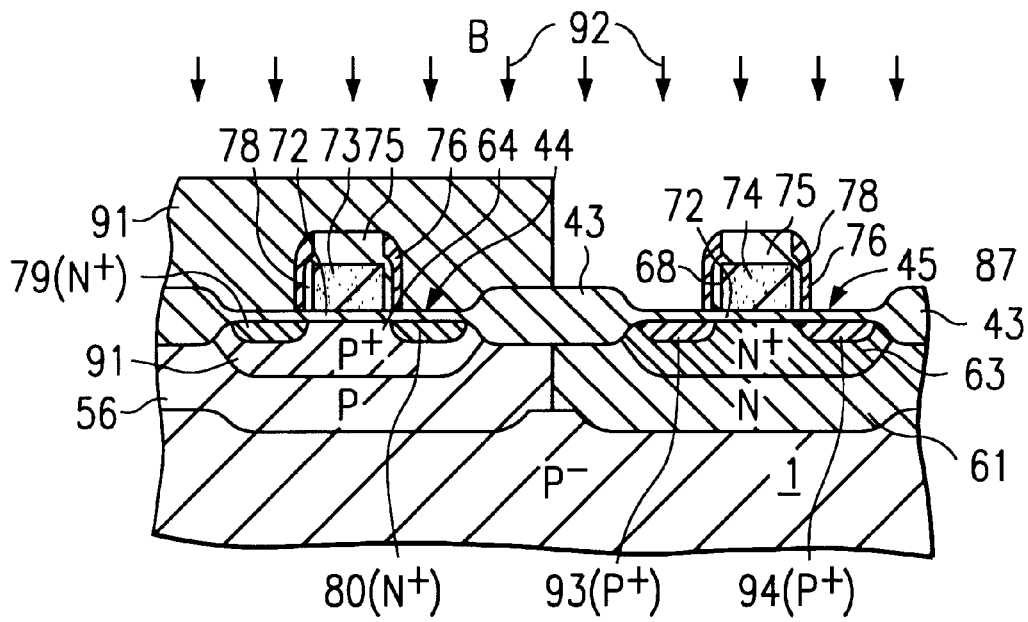
FIGS. 14*a*, 14*b* are cross sections of the main parts showing another stage.
Figure 14B:
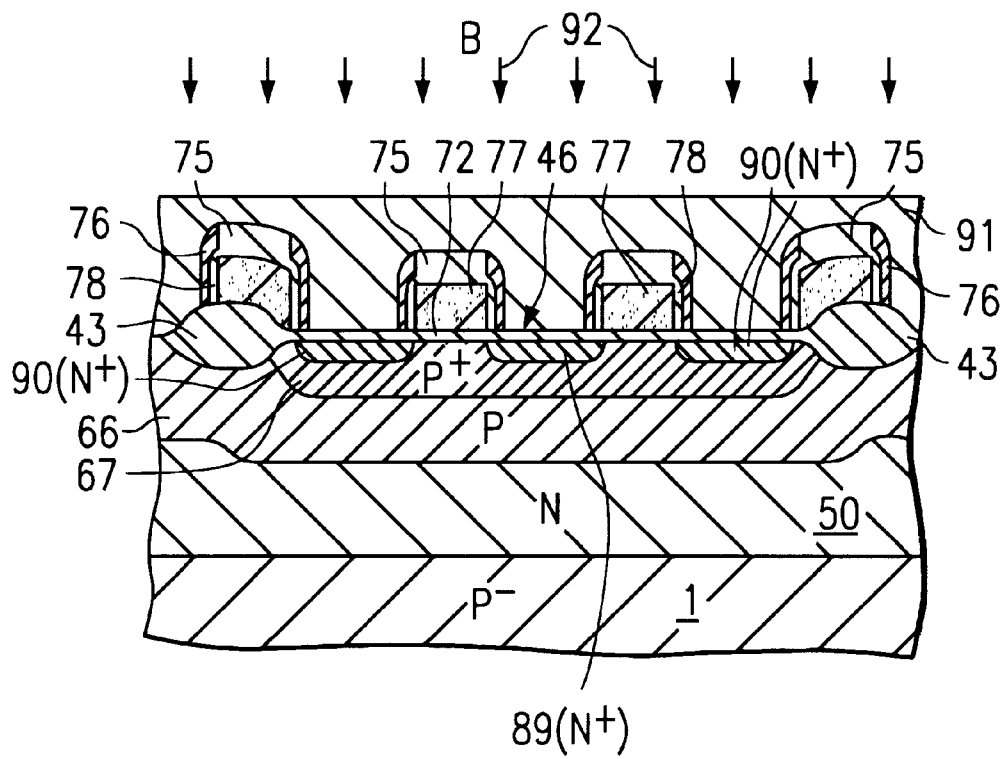

Next, as shown in FIGS. 14a, 14b, the photoresist mask 87 is removed, and another photoresist mask 91 is formed on the element regions 44 and 46. Then, a p-type impurity such as boron ion beam 92 is irradiated through an opening 91A, and p$^+$-type impurity-implanted regions (source and drain regions) 93 and 94 are formed in a self-aligned fashion into the n$^+$-type region 63.

Figure 15A:
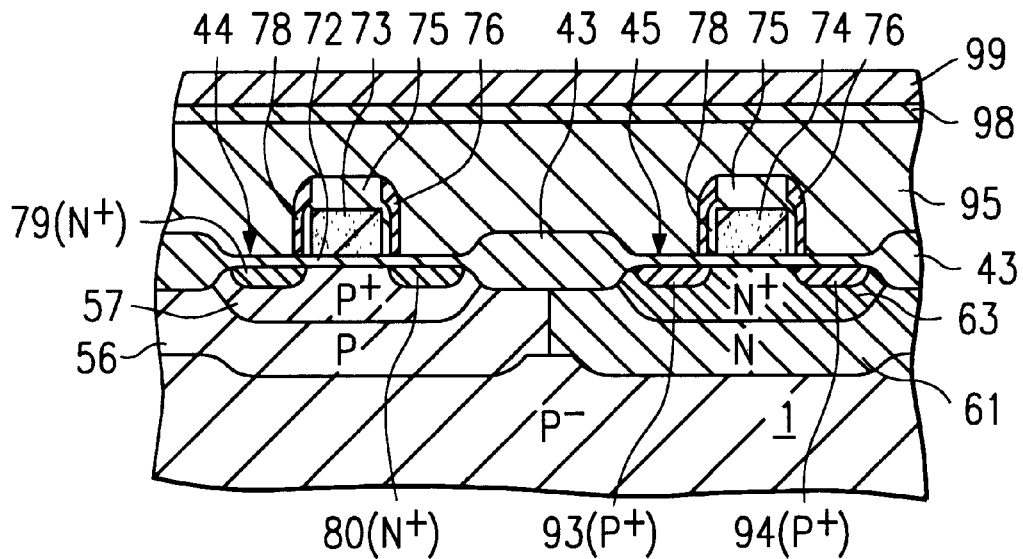
FIGS. 15*a*, 15*b* are cross sections of the main parts showing another stage.
Figure 15B:
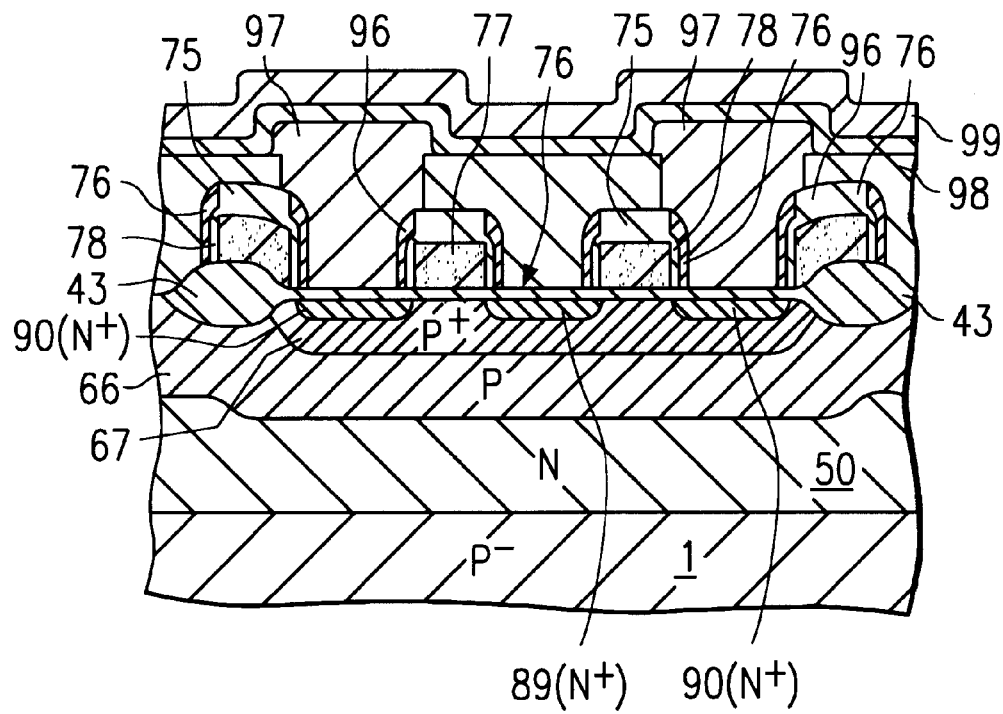

Next, as shown in FIGS. 15a, 15b, an SiO$_2$ insulating layer 95 deposited on the entire surface by CVD (Chemical vapor deposition) is selectively etched, and a contact hole 96 is formed on a n$^+$-type region 90. Then, a polysilicon deposited by the CVD is patterned, and a polysilicon storage node electrode 97 is deposited on the contact hole 96. Furthermore, a dielectric film (for example, silicon nitride film) 98 and a polysilicon plate electrode 99 are formed in order on the entire surface by the CVD.

Figure 16A:
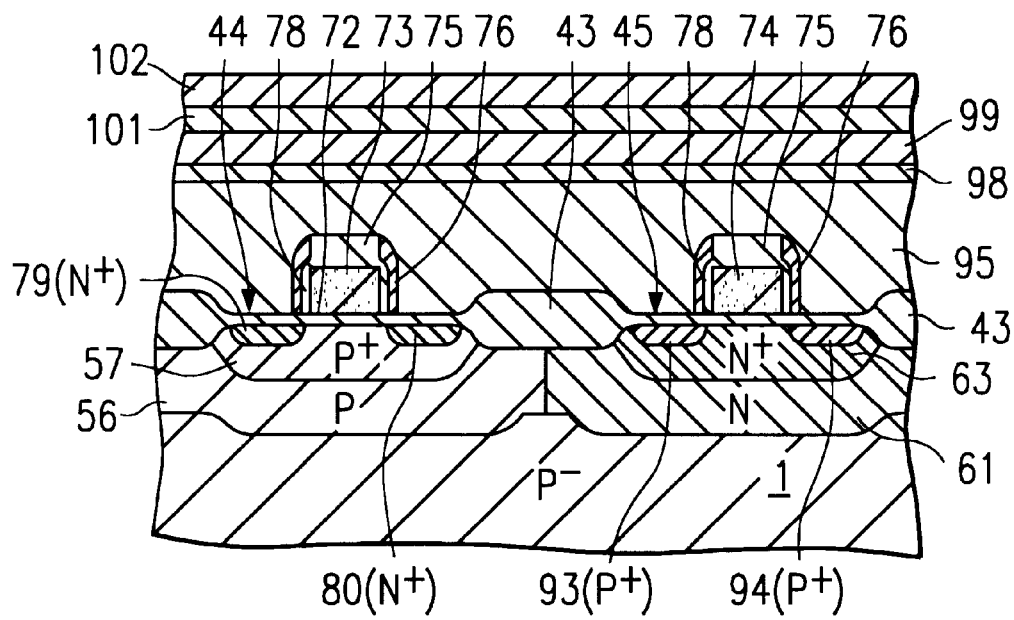
FIGS. 16*a*, 16*b* are cross sections of the main parts showing another stage.
Figure 16B:
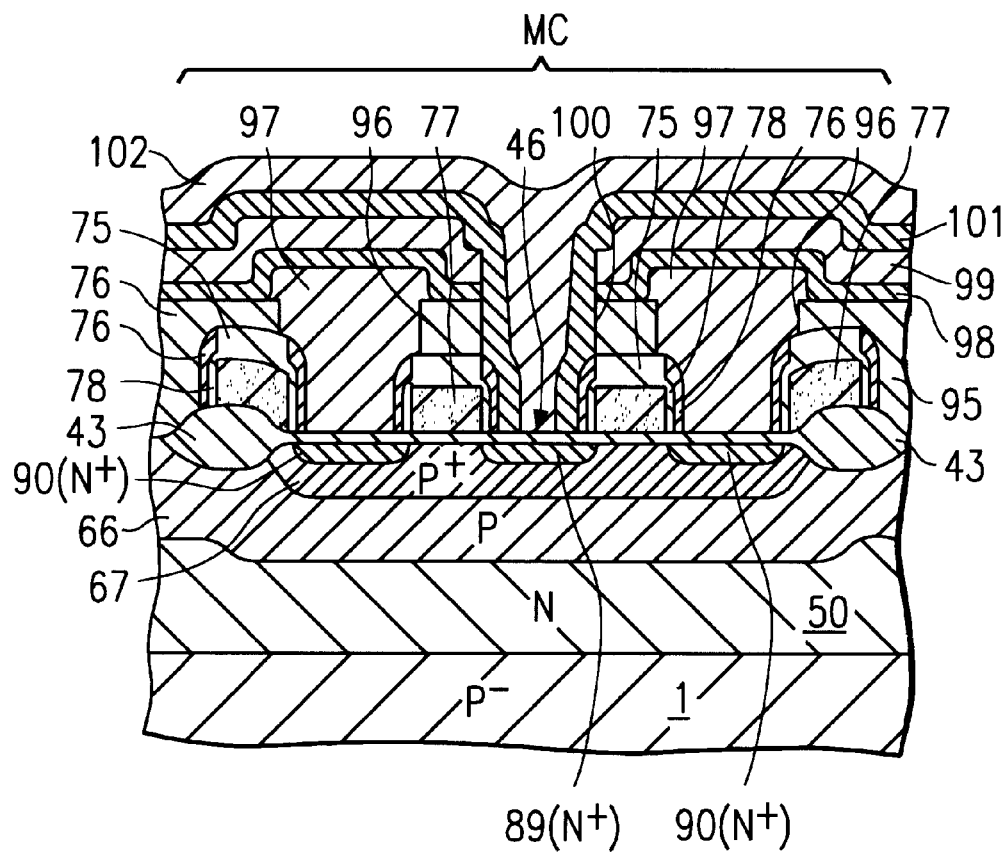

Next, as shown in FIGS. 16a, 16b, the plate electrode 99, dielectric film 98, and insulating film 95 on the n$^+$-type region 89 are selectively etched in the element region 46, and a contact hole 100 is formed. Then, the n$^+$-type region 89 is exposed by etching a SiO$_2$ insulating layer 101 deposited on the entire surface by the CVD. Then, a tungsten bit line 102 is deposited on the entire surface by sputtering, so that a memory cell MC is completed.

Figure 17A:
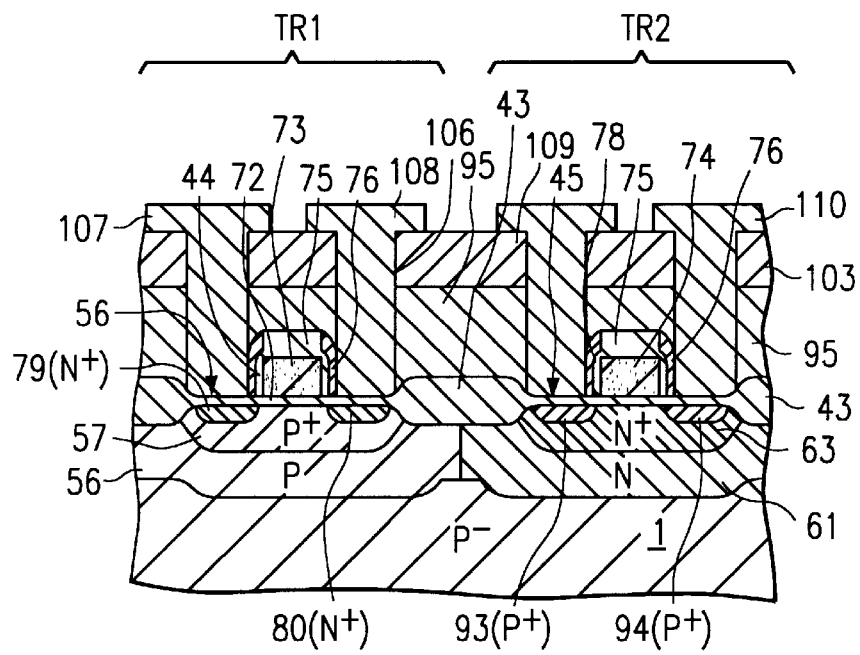
FIGS. 17*a*, 17*b* are cross sections of the main parts showing the same and another stage.
Figure 17B:
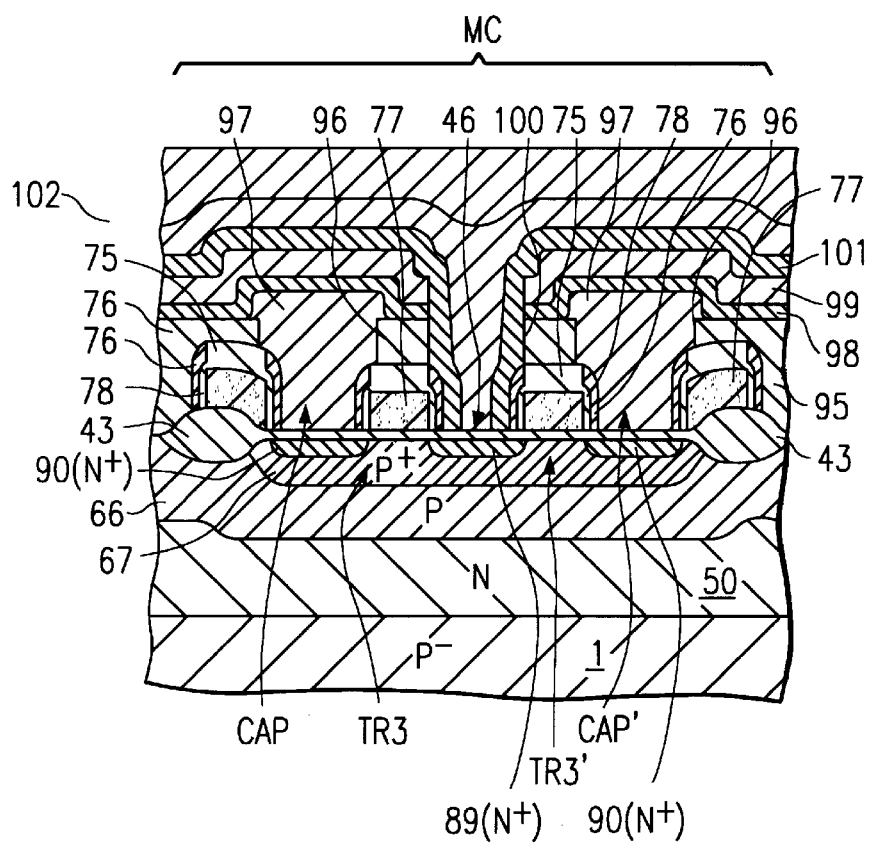

Next, as shown in FIGS. 17a, 17b, after layers 102, 101, 99, and 98 of the peripheral circuit part are removed in order by etching, a contact hole 106 is respectively formed on the respective impurity-implanted region 79, 80, 93, and 94 in an SiO$_2$ insulating layer 103 deposited on the entire surface by the CVD, and these respective electrodes 107, 108, 109, and 110 (source or drain electrode) are deposited. Thus, in the peripheral circuit part PC, the n-channel MOSFET TR$_1$ is manufactured on the p-type well 56, and the p-channel MOSFET TR$_2$ is manufactured on n-type well 61. They can be used as a driving element such as sense amplifier.

On the other hand, in the memory cell array part MA, the memory cell MC to which each transistor gate TR$_3$ and TR$_3$' are connected is manufactured between the bit line 103 and a pair of storage nodes (capacitors) CAP and CAP' on the p-type well 66.

In the above-mentioned manufacturing process of this embodiment, the following distinct operation effects (A)–(F) are exerted, compared with the above-mentioned conventional technique.

(A) First, as shown in FIGS. 1a, b; 2a, b; 3a, b; 4a, b, the selective oxide film (field SiO$_2$ film) made by LOCOS is formed prior to the formation of the well, and the residual stress due to the LOCOS is relaxed by the subsequent high-temperature annealing treatment. Then, without carrying out any LOCOS, necessary wells are formed in the element regions using the field SiO$_2$ film as part of the mask by various kinds of ion implantations. Therefore, the number of processes required for manufacturing elements including the formation of the respective wells is reduced, and the process is simplified.

(B) Since the residual stress of the LOCOS is removed at the initial stage of the process by the high-temperature annealing, the process is further accelerated.

(C) After the LOCOS, since there is no step difference on the surface between the element regions and the flatness is maintained, focusing of the pattern exposure is equivalent between each element region in the formation of a polysilicon gate electrode (refer to FIGS. 12a, 12b), etc., and patterning as designed can be carried out, which is advantageous in improvement of the miniaturization and the degree of integration.

Figure 18:
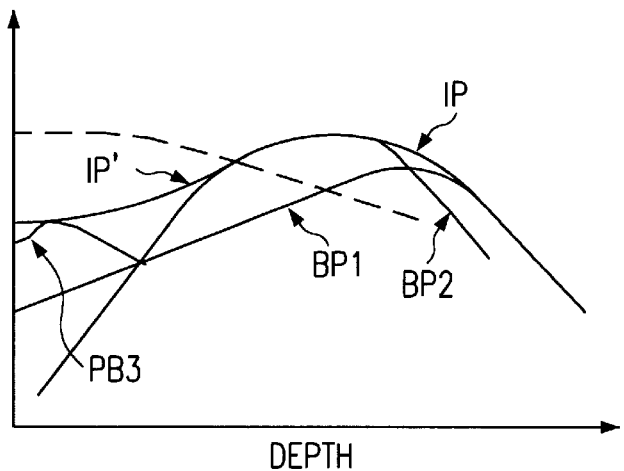
FIG. 18 is an outlined diagram showing a well concentration profile obtained by ion implantation in this manufacturing process.
Figure 19:
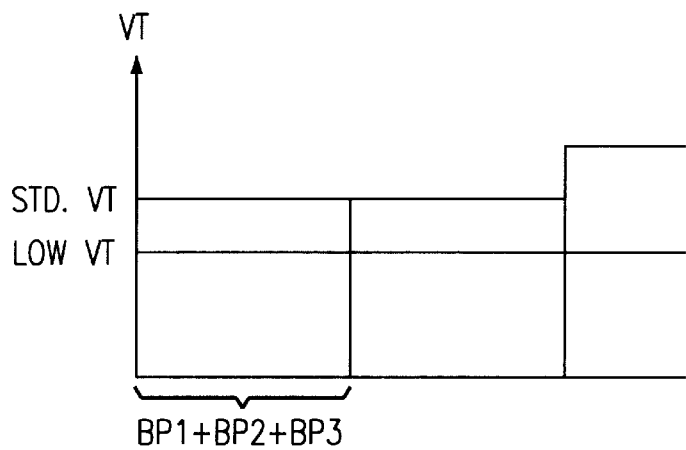
FIG. 19 is an outlined diagram showing the threshold voltage of a MOS transistor due to this ion implantation.

(D) Also, as shown in FIGS. 5a,b–7a,b, the boron ion implantations BP1, BP2, and BP3 are carried out at three kinds of energies using the field SiO$_2$ film 43 as part of the mask, so that a low-resistance p-type well, p$^+$-type channel stopper (it is characterized that it is formed in the entire element region in the p-type well), and surface region of natural V$_t$ are respectively formed in the same element region. Thus, as shown in FIGS. 18 and 19, a desired threshold (natural V$_t$ or low V$_t$) and the well concentration of a desired profile IP can be simultaneously realized by these three kinds of ion implantations. Also, since the natural V$_t$ or low V$_t$ is always obtained, if it is necessary to raise the V$_t$ beyond that, the boron ion implantation is further added as needed, and for example, standard V$_t$ (std. V$_t$), etc., can be easily realized under the use of the same mask.

(E) Therefore, unlike the conventional technique, the patterning for adjusting a low threshold voltage and the ion implantation can be omitted, so that the number of processes for obtaining the low threshold can be reduced by at least about one or two.

(F) Also, in the above-mentioned wells 56 and 66, a profile part IP', in which the impurity concentration is increased in the depth direction of the well, is formed as shown in FIG. 18 by a combination of the above-mentioned ion implantations BP1, BP2, and BP3 (in particular, by the BP2 for a channel stopper). In other words, owing to the retrograde profile, it is possible to prevent a so-called latch-up, in which a parasitic transistor generated between the well and the transistor is turned on so that a current flows between them. On the contrary, in the conventional technique, since the introduction of impurities for a channel stopper right under the LOCOS is its main process, only the profile which is reduced in its depth direction is formed as a well concentration as indicated by broken lines in FIG. 18, and the above-mentioned latch-up cannot be sufficiently prevented.

Figure 20:
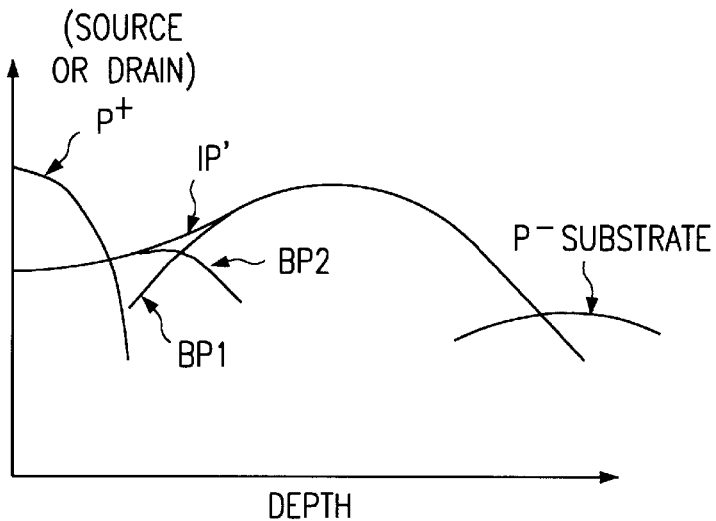
FIG. 20 is an outlined diagram showing another well concentration profile obtained by an ion implantation in the same manufacturing process.
Figure 21:
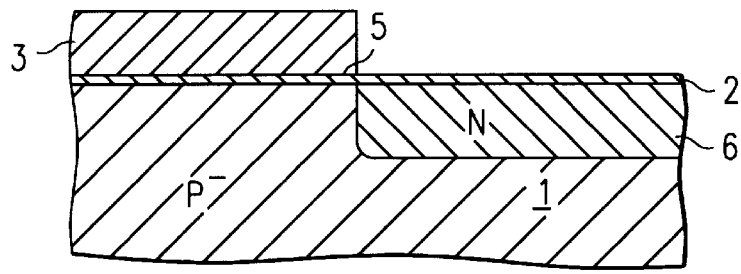
FIG. 21 is a cross section showing one step in a conventional process for making complementary MOSFETs on the same p−-type silicon substrate using the LOCOS isolation method, in which an impurity is implanted by a phosphorous ion beam to form an n-type well.
Figure 22:
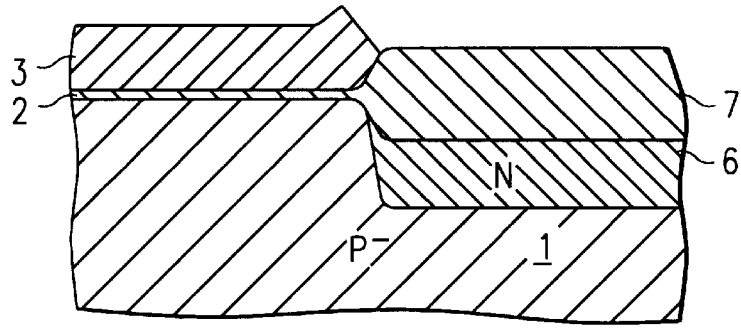
FIG. 22 is a cross section showing a subsequent step of LOCOS growing of a thick $SiO_2$ layer 7.
Figure 23:
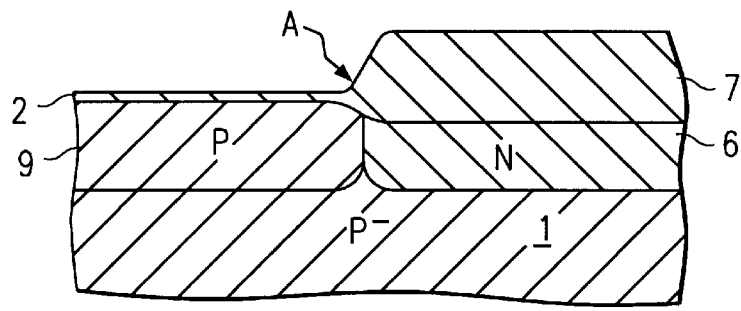
FIG. 23 is a cross section showing a subsequent step of implanting an impurity by a phosphorous ion beam to form a p-type well.
Figure 24:
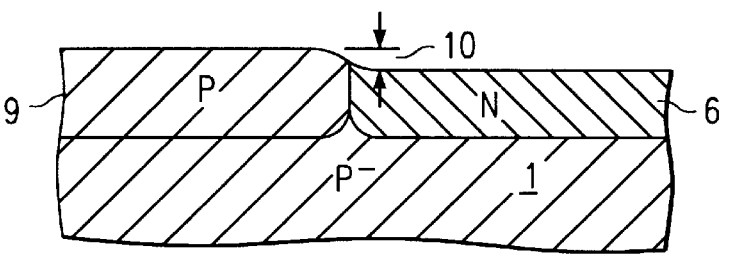
FIG. 24 is a cross section showing a level difference or step between the tops of adjacent wells.
Figure 25:
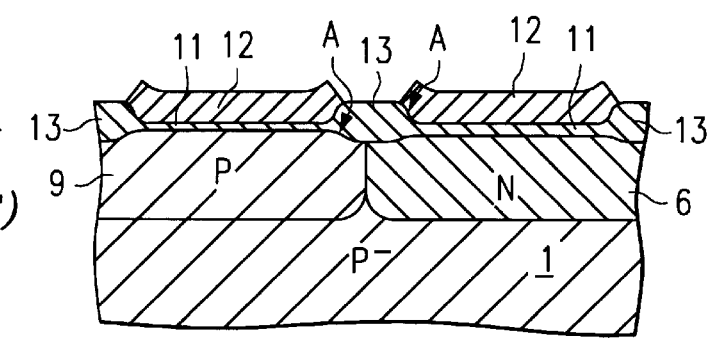
FIG. 25 is a cross section showing a subsequent step of using a mask to selectively form a field $SiO_2$ layer by LOCOS oxidation around the periphery of each well.
Figure 26:
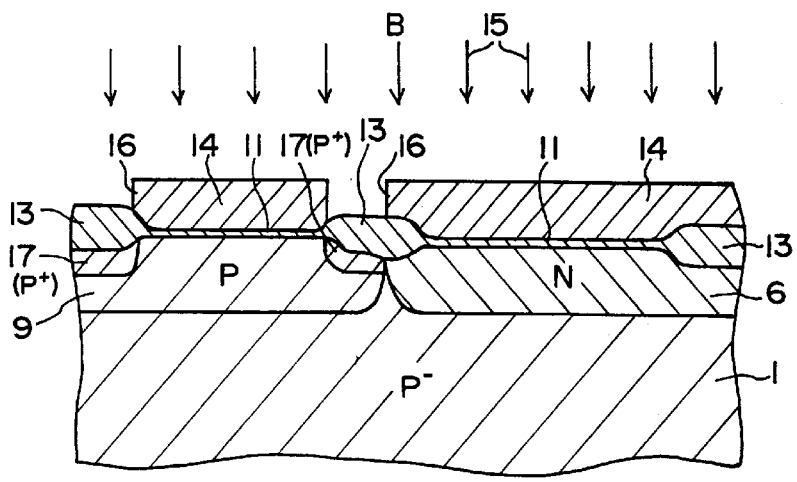
FIG. 26 is a cross section showing a subsequent step of irradiating a boron ion beam through a $SiO_2$ layer to ion-implant a $p^+$-type region as a channel stopper at the periphery of a p-type well.
Figure 27:
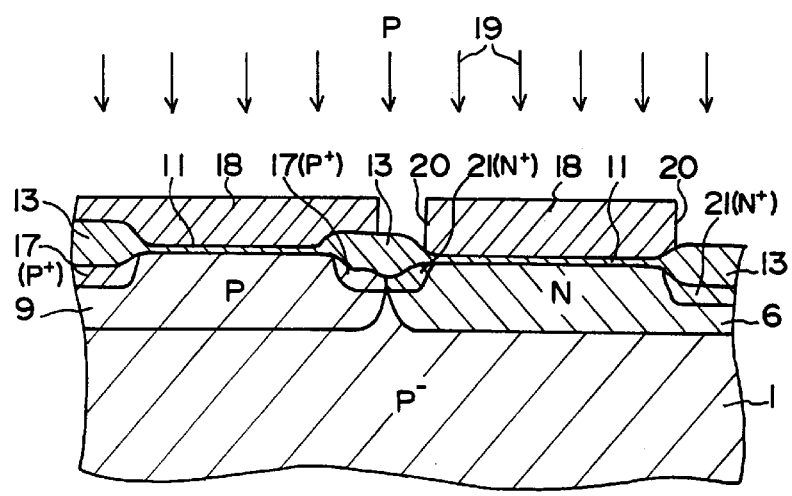
FIG. 27 is a cross section showing a subsequent step of irradiating a phosphorous ion beam through a $SiO_2$ layer to ion-implant an $n^+$-type region as a channel stopper at the periphery of an n-type well.
Figure 28:
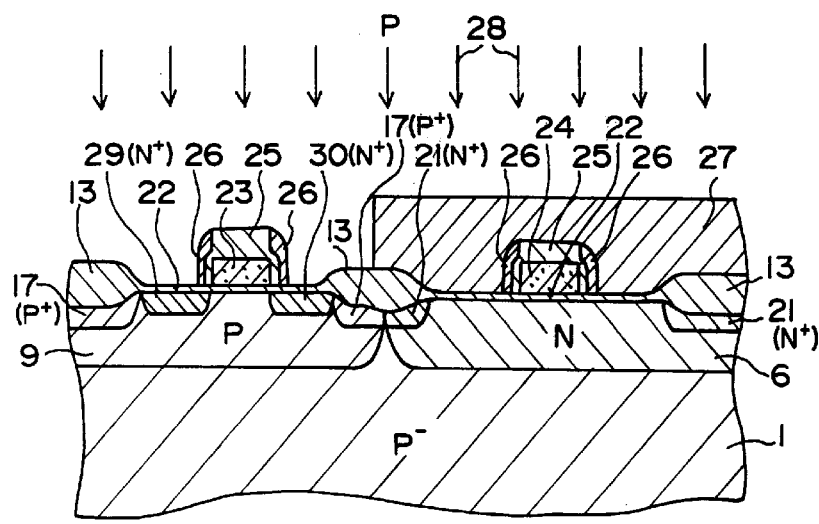
FIG. 28 is a cross section showing a subsequent step of irradiating a phosphorous beam through a $SiO_2$ layer to ion-implant $n^+$-type source and drain regions in a p-type well.
Figure 29:
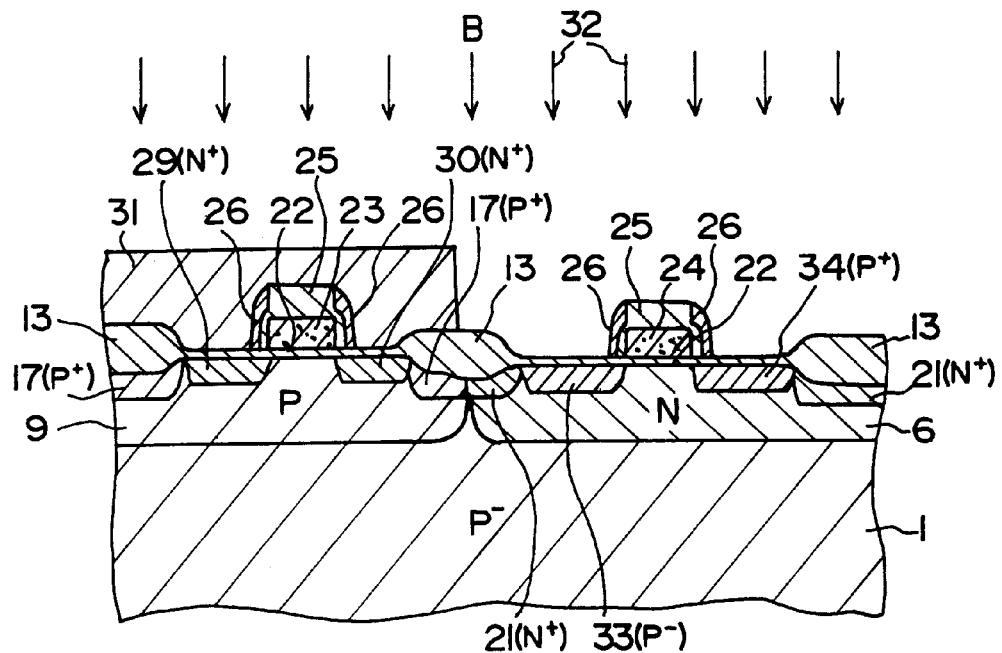
FIG. 29 is a cross section showing a subsequent step of irradiating a boron beam through a $SiO_2$ layer to ion-implant $p^+$-type source and drain regions in an n-type well.
Figure 30:
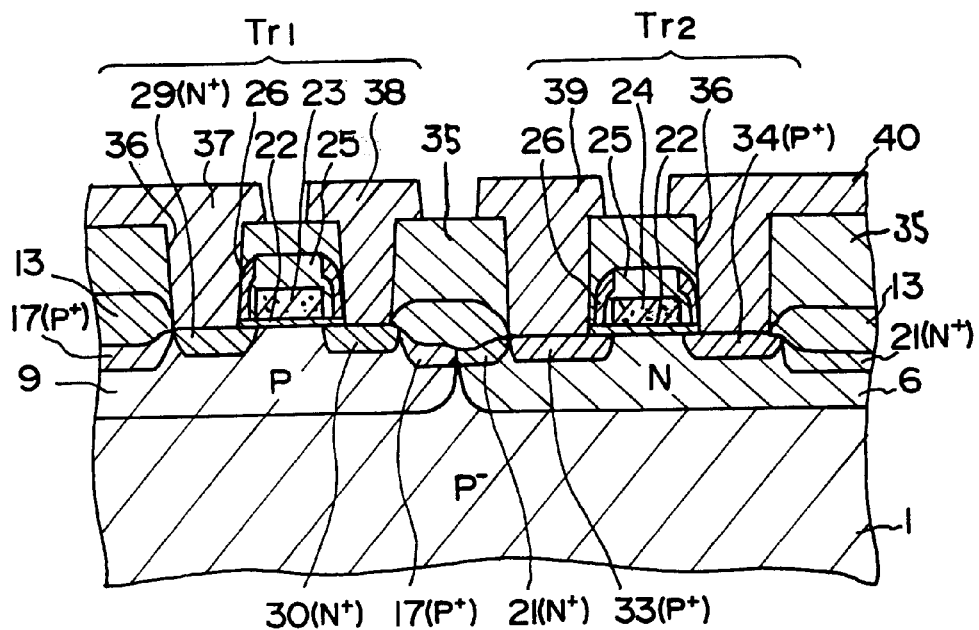
FIG. 30 is a cross section of a subsequent step when n-channel MOSFET Tr1 and p-channel MOSFET Tr2 have been formed.

This phenomenon is also similar in the other well 61 of the peripheral circuit part, and as shown in FIG. 20, since the phosphor concentration profile in the well is the retrograde IP', the latch-up due to the parasitic transistor can also be prevented.

So far, the embodiments of our invention have been explained, however the above-mentioned embodiments can be variously modified based on the technical concept of our invention.

For example, starting with the annealing conditions after the above-mentioned LOCOS, the energy of the ion implantation, dosage, the kind of ion, etc., may be variously modified, and these conditions can be appropriately determined in accordance with the intended threshold value. In particular, the above-mentioned high-temperature annealing can be changed in a range of 1000–1200° C. and from several tens of minutes to several hours, and the above-mentioned conditions of BP1, BP2, and BP3 may be adopted in a range of an acceleration energy of several tens of keV to several hundred keV and a dosage of $1 \times 10^{11}$ to $1 \times 10^{13}/$cm$^2$. The conductivity type of each of the above-mentioned semiconductor regions may be respectively changed to the opposite conductivity type.

Also, our invention is suitable for the above-mentioned DRAM, however needless to say, it can be applied to other elements and devices which require the above-mentioned triple well and impurity concentration profile.

According to our invention, as mentioned above, after the selective oxide film for separating elements is formed, impurities of a conductivity type opposite that of the semiconductor substrate are introduced, and the selective oxide film is simultaneously annealed at the time of forming deep wells by a high-temperature treatment. Thus, the residual stress from the selective oxide film can be removed, and the deep wells are activated. At the same time, the desired well concentration and threshold voltage can be obtained. Furthermore, they can be realized without the addition of the subsequent high-temperature annealing treatment and the impurity diffusion for adjusting the threshold voltage, and the number of processes can be reduced. Also, since the selective oxidation may be carried out once at the time of formation of the deep wells, the surface between the element regions separated by the selective oxide is held on the same surface, so that the pattern exposure can be carried out with high precision and a fine patterning of gate electrodes, etc., is enabled.

We claim:

1. A method of forming a semiconductor device comprising the following steps:
    a) forming a field oxide on a semiconductor substrate by the LOCOS method for defining a deep well and a twin well;
    b) then forming said deep well in the semiconductor substrate by ion implementation;
    c) annealing resultant structure at a temperature of substantially 1200° C. to activate said deep well and simultaneously stress relieve an oxide layer formed by said LOCOS method;
    d) forming said twin well in said semiconductor substrate by ion implantation; and
    e) forming a first transistor in said deep well and a second transistor in said twin well.

2. The method of claim 1 wherein the ion implantation for forming the well implants the ions through said field oxide.

3. The method of claim 1 further comprising annealing the said device at substantially 1000° C. after performing step e).

4. The method of claim 2 further comprising annealing the said device at substantially 1000° C. after performing step e).

5. A method of forming a DRAM comprising the following steps in order:
    a) forming a field oxide on a semiconductor substrate by the LOCOS method for defining a deep well in a portion of the semiconductor substrate where a memory cell will be formed and for defining a twin-well in a peripheral portion of the device;
    b) forming said deep well by ion implantation;
    c) annealing resultant structure at a temperature of substantially 1200° C. to activate said deep well and simultaneously stress relieve an oxide layer formed by said LOCOS method;
    d) forming said twin-well by ion implantation; and
    e) forming transistors in the twin-well and the deep well.

6. The method of claim 5 wherein the ion implantation for forming the well implants the ions through said field oxide.

7. The method of claim 5 further comprising the step of annealing the device at substantially 1000° C. after performing step e).

* * * * *